US005353191A

United States Patent [19]

Volz et al.

[11] Patent Number: 5,353,191

[45] Date of Patent: Oct. 4, 1994

[54] COMBINATION HEAT SINK AND HOUSING FOR FLEXIBLE ELECTRICAL CONNECTOR USED IN AN ELECTRICAL OR ELECTRONIC ASSEMBLY

[75] Inventors: Keith L. Volz, Jamestown; Frederick R. Deak, Kernersville; David C. Johnson; Warren A. Bates, both of Winston-Salem; Robert M. Renn, Pfafftown, all of N.C.

[73] Assignee: The Whitaker Corporation, Wilmington, Del.

[21] Appl. No.: 27,969

[22] Filed: Mar. 8, 1993

[51] Int. Cl.[5] .................... H05K 7/20

[52] U.S. Cl. .................... 361/690; 361/789; 361/744; 439/485; 439/487

[58] Field of Search .................... 361/690, 704, 785, 789, 361/744; 439/485, 487

[56] References Cited

U.S. PATENT DOCUMENTS

| | | | |
|---|---|---|---|
| Re. 29,513 | 1/1978 | Johnson | 439/485 |
| 3,582,865 | 6/1971 | Franck | 361/383 |
| 4,390,218 | 6/1983 | Kruger | 439/485 |
| 5,124,883 | 6/1992 | Bakker | 361/386 |

OTHER PUBLICATIONS

ETI, "Elastomeric Connector Catalog", 1989.

*Primary Examiner*—Gregory D. Thompson

[57] ABSTRACT

A unitary heat sink and connector housing (10, 10′, 10″, 10‴) is disposed between a pair of electrical members, such as printed circuit boards (11, 12, 31) and/or flexible etched circuits (32) in an overall assembly used in a variety of high-performance miniaturized electronic products. One or more flexible electrical connectors (21, 25, 26, 29, 30) are mounted within the unitary heat sink and connector housing (10, 10′, 10″, 10‴) and provide a circuit interface between respective circuit elements or pads (13, 14) on the printed circuit boards (11, 12, 31) and/or flexible etched circuits (32), respectively. The unitary heat sink and connector housing (10, 10′, 10″, 10‴), which preferably has heat-radiating fins (20), is made from a material which is thermally conductive but electrically non-conductive. Examples of such a material are anodized aluminum, silicon dioxide and beryllium oxide. Any suitable ceramic material could be used.

11 Claims, 7 Drawing Sheets

COMBINATION HEAT SINK AND HOUSING FOR FLEXIBLE ELECTRICAL CONNECTOR USED IN AN ELECTRICAL OR ELECTRONIC ASSEMBLY

FIELD OF THE INVENTION

The present invention relates to a combination heat sink and housing for an electrical connector, and more particularly, for a flexible electrical connector providing a circuit interface between respective circuit elements in an electrical or electronic assembly.

BACKGROUND OF THE INVENTION

Flexible electrical connectors are used in a variety of miniaturized high-performance electronic assemblies. Traditionally, these flexible electrical connectors are housed in a connector housing which is molded from a suitable plastic material, and the connector housing may be disposed between a pair of printed circuit boards in a typical product application.

Each flexible electrical connector comprises a plurality of finely-spaced circuit elements or traces carried by an elastomeric core. The traces may be formed from a gold-plated nickel-clad copper foil for superior conductivity. Typically, these traces are 3 mils wide with a 7 mils center-to-center spacing, such that the traces have a 4 mils spacing therebetween. A complete line of flexible electrical connectors is supplied by AMP Incorporated of Harrisburg, Pa. under its registered "AMPLIFLEX" trademark.

In miniaturized high-performance electronic assemblies, such as those used in communication equipment, notebook or laptop computers, and products in the consumer electronics industry, space is at a premium; and very often, the product design must also be adapted to a particular configuration dictated by product function and existing housings. As a result, heat dissipation may become a serious problem and, unless alleviated, could result in deteriorated performance and, ultimately, product failure and reliability problems.

SUMMARY OF THE INVENTION

Accordingly, it is an object of the present invention to provide a combination heat sink and housing for a flexible electrical connector used in an electrical or electronic assembly, such that the flexible electrical connector provides a good circuit interface and facilitates product miniaturization, while the combination heat sink and housing dissipates the heat generated within the assembly, thereby substantially improving product reliability.

The present invention finds particular utility in an electrical assembly, including a first electrical member having at least one first circuit element thereon, and a second electrical member having at least one second circuit element thereon. In accordance with the teachings of the present invention, there is provided a unitary heat sink and connector housing disposed between the first and second electrical members and made from a material which is thermally-conductive but electrically insulative; and a means is provided for securing the first and second electrical members to the unitary heat sink and connector housing. A flexible electrical connector is disposed in the unitary heat sink and connector housing, and the flexible electrical connector has at least one circuit trace thereon providing a circuit interface between the first and second circuit elements on the first and second electrical members, respectively.

Preferably, the material of the unitary heat sink and connector housing is selected from the group consisting of anodized aluminum, silicon dioxide and beryllium oxide; any suitable ceramic material, having the desired properties, may also be employed.

In a preferred embodiment, the unitary heat sink and connector housing has a plurality of heat-radiating fins.

These and other objects of the present invention will become apparent from a reading of the following specification taken in conjunction with the enclosed drawings.

GENERAL DESCRIPTION OF THE PREFERRED EMBODIMENTS

Figure 1:
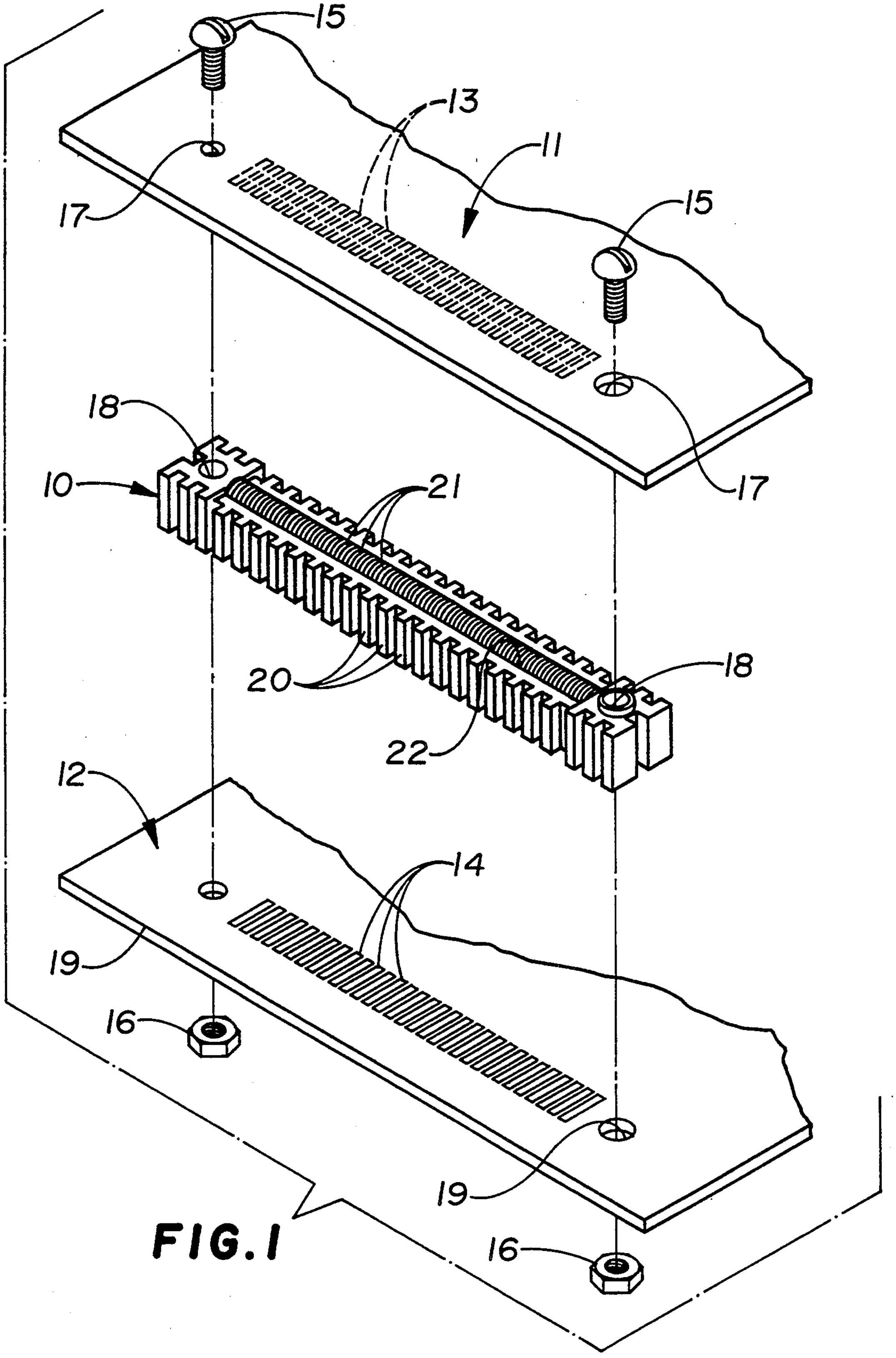
FIG. 1 is an exploded perspective of a first embodiment of the present invention, wherein a combination heat sink and connector housing is provided with a plurality of heat-radiating fins and is disposed between a pair of printed circuit boards.
Figure 2:
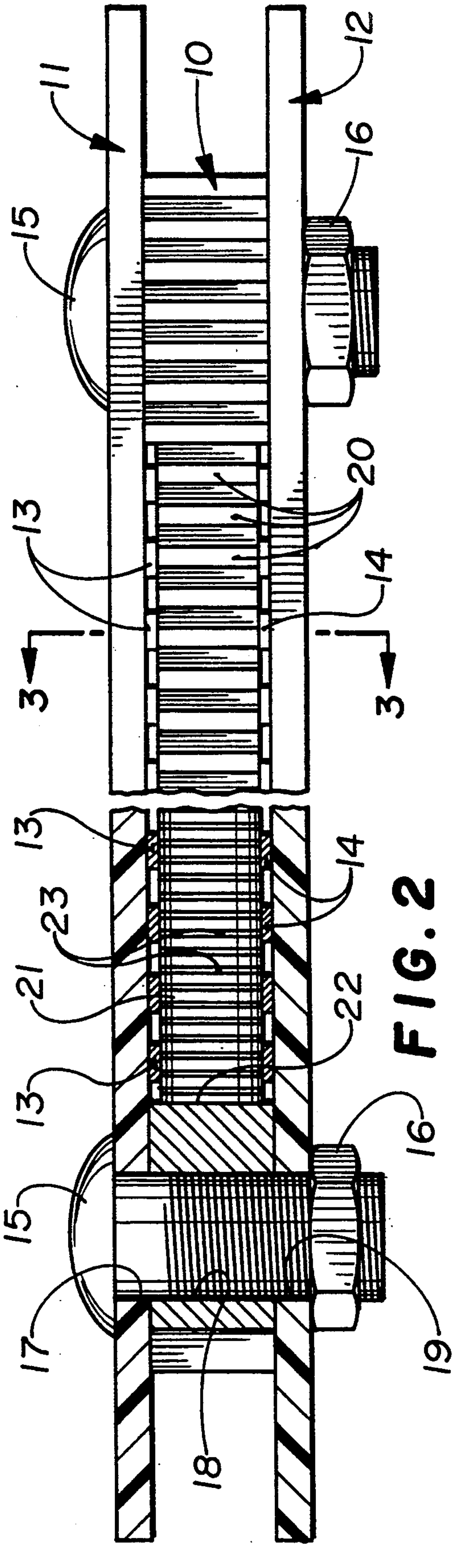
FIG. 2 is a front view thereof, partially in section and partially in elevation, and showing the components of FIG. 1 in their assembled relationship.
Figure 3:
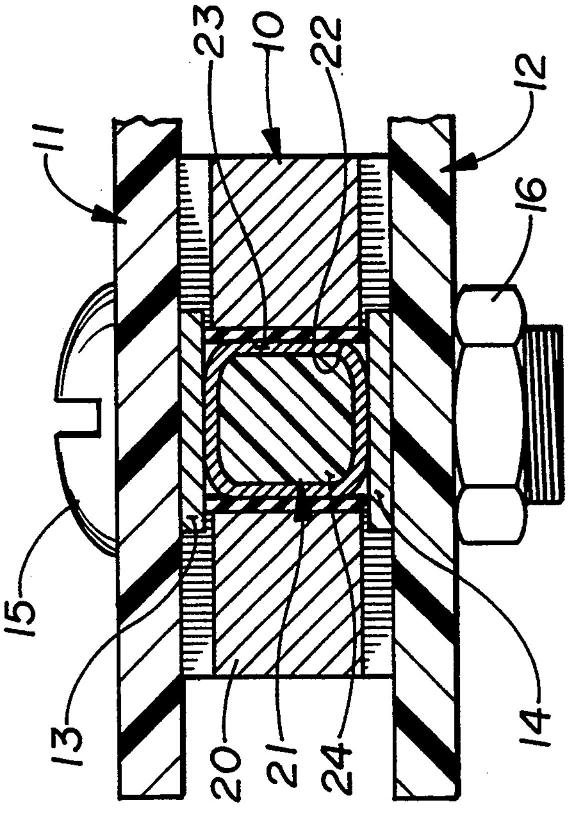
FIG. 3 is a cross-sectional view thereof, taken across the lines 3—3 of FIG. 2, and drawn to an enlarged scale.

With reference to FIGS. 1-3, a unitary heat sink and connector housing 10 is disposed between first and second electrical members comprising a pair of printed circuit boards 11 and 12, respectively. The first printed circuit board ("PCB") 11 has a first plurality of respective circuit elements or pads 13 thereon, and the second printed circuit board ("PCB") 12 has a second plurality of respective circuit elements or pads 14 thereon. The overall assembly is secured together by respective bolts 15 and nuts 16 (or other suitable fastening means) and the bolts 15 pass through respective holes 17 in the first PCB 11, holes 18 in the unitary heat sink and connector housing 10, and holes 19 in the second PCB 12. The unitary heat sink and connector housing 10 is substantially oblong and, in this embodiment, is provided with a plurality of spaced-apart fins 20 for heat-radiating purposes.

The unitary heat sink and connector housing 10 is made from a material which is thermally conductive but electrically non-conductive or insulating. Examples of such a material are anodized aluminum, silicon oxide and beryllium oxide. It will be understood, however, that any suitable ceramic material (having the desired properties) may also be employed.

A flexible electrical connector 21 is disposed within a slotted opening 22 formed longitudinally in the unitary heat sink and connector housing 10. The flexible electrical connector 21 comprises a plurality of finely-spaced or finely-pitched circuit traces 23 carried by an elastomeric core 24. In the overall assembly, as shown more clearly in FIG. 3, the elastomeric core 24 is compressed between the printed circuit boards 11 and 12; and the circuit traces 23 provide the circuit interface between the respective circuit pads 13 and 14 on the printed circuit boards 11 and 12, respectively.

Figure 4:
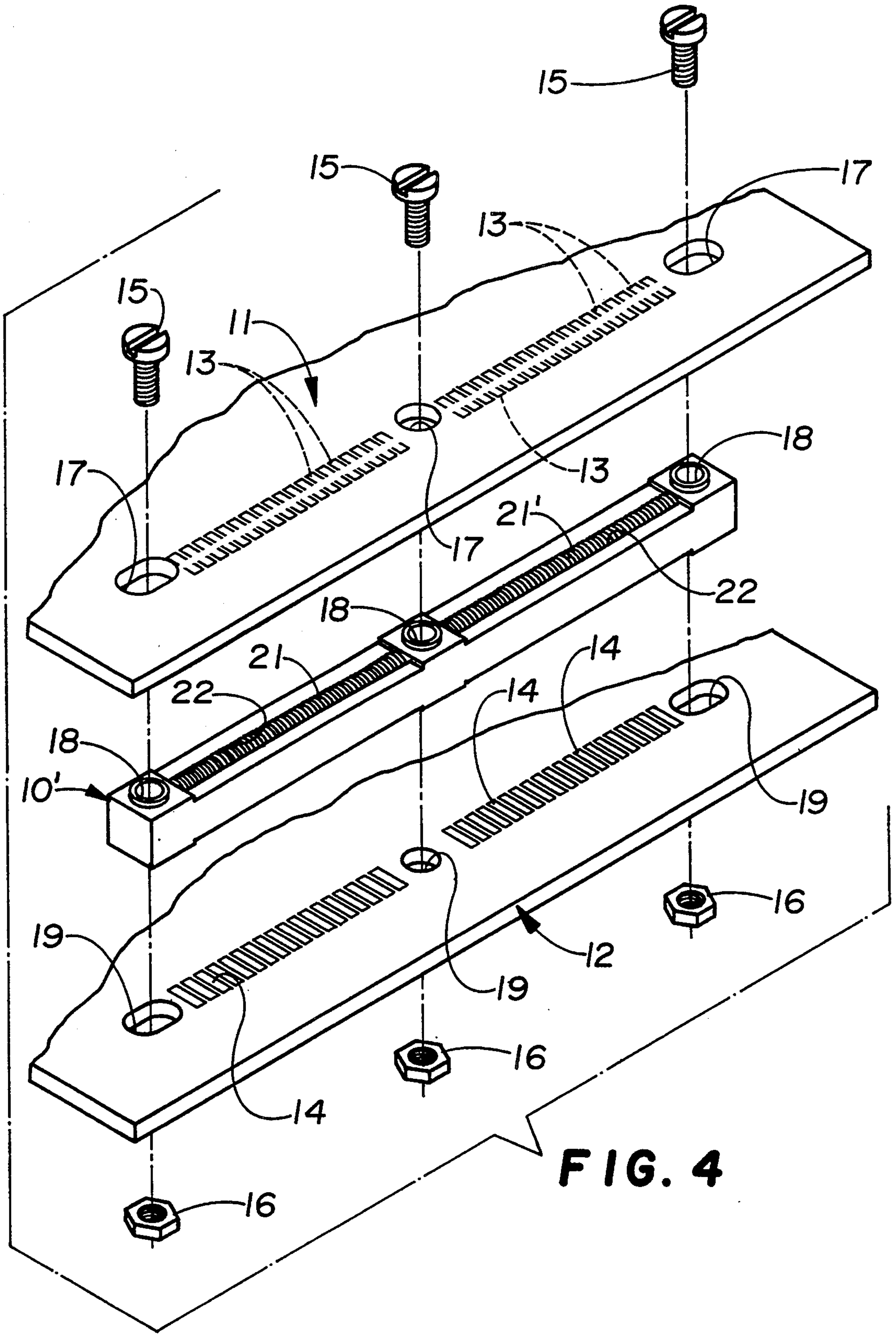
FIG. 4 is an exploded perspective of a second embodiment, corresponding substantially to FIG. 1, but showing a pair of flexible electrical connectors in an end-to-end relationship within a combination heat sink and connector housing (the heat-radiating fins being omitted for ease of illustration).

With reference to FIG. 4 (wherein like numbers have been used to identify parts identical to, or substantially similar to, the components of FIGS. 1-3) a pair of flexible electrical connectors 21 and 21' are shown in an end-to-end relationship in a unitary heat sink and connector housing 10'.

Figure 5:
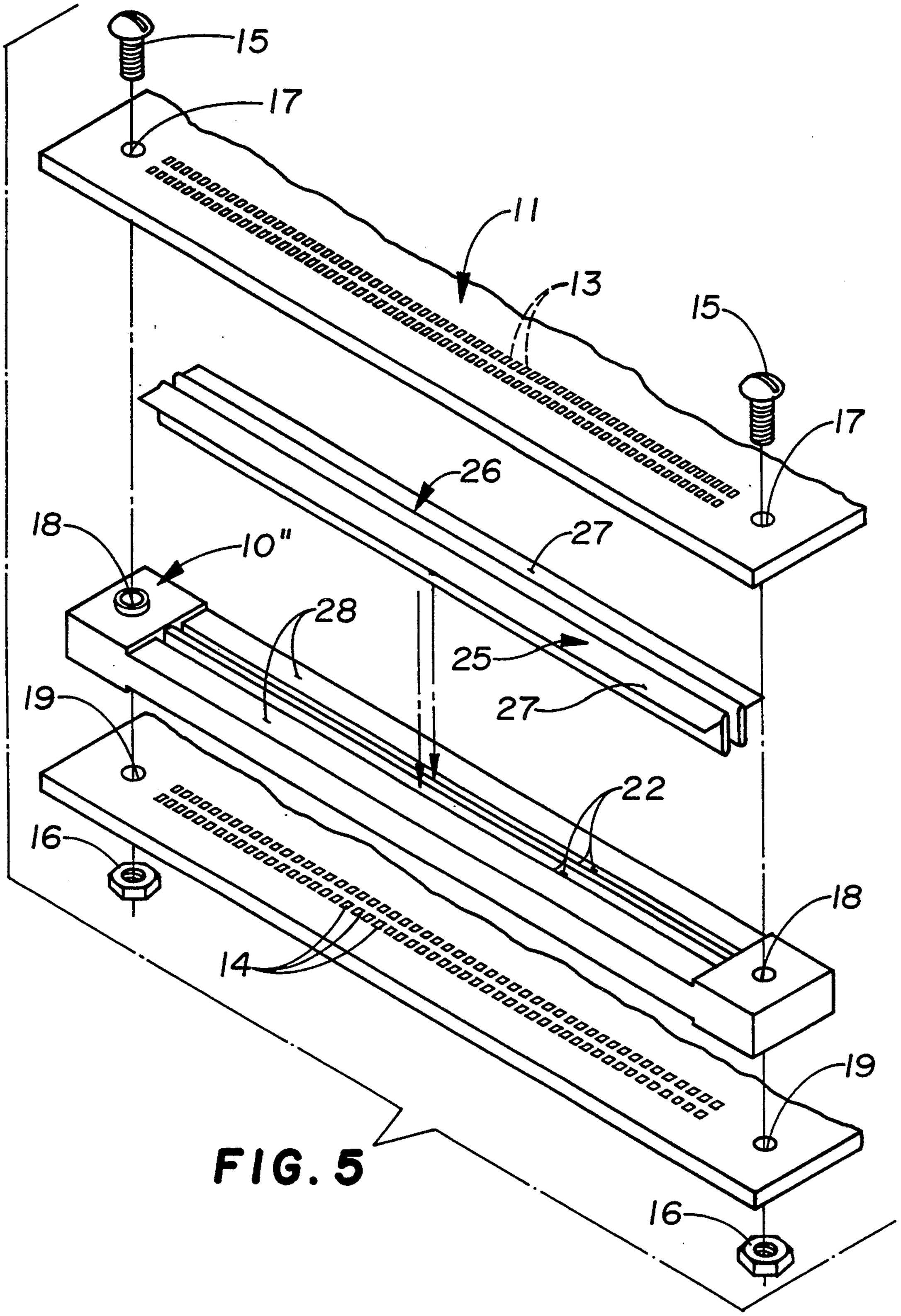
FIG. 5 is an exploded perspective of a third embodiment, corresponding substantially to FIG. 1, but showing a pair of flexible electrical connectors in a side-by-side relationship within a combination heat sink and connector housing (and, again, the heat-radiating fins being omitted for ease of illustration).
Figure 6:
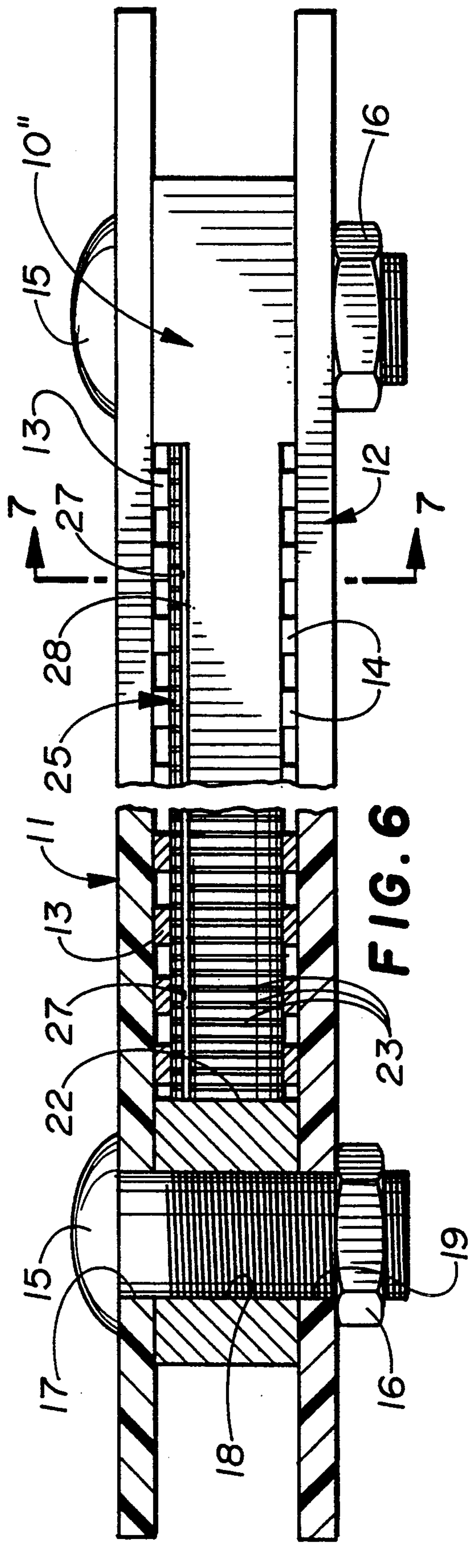
FIG. 6 is a front view thereof, partially in section and partially in elevation, and showing the components in their assembled relationship.
Figure 7:
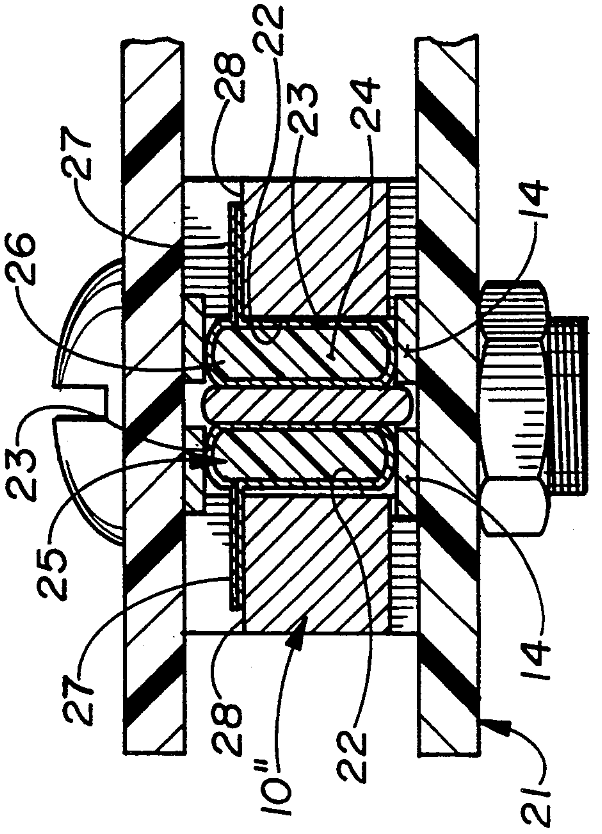
FIG. 7 is a cross-sectional view thereof, taken across the lines 7—7 of FIG. 6, and drawn to an enlarged scale.

With reference to FIGS. 5-7, a pair of flexible electrical connectors 25 and 26 are mounted in a side-by-side relationship within a unitary heat sink and connector housing 10". These flexible electrical connectors 25 and 26 have respective tails 27 (substantially at right angles thereto) and these tails 27 are supported on an undercut portion 28 on the unitary heat sink and connector housing 10".

Figure 8:
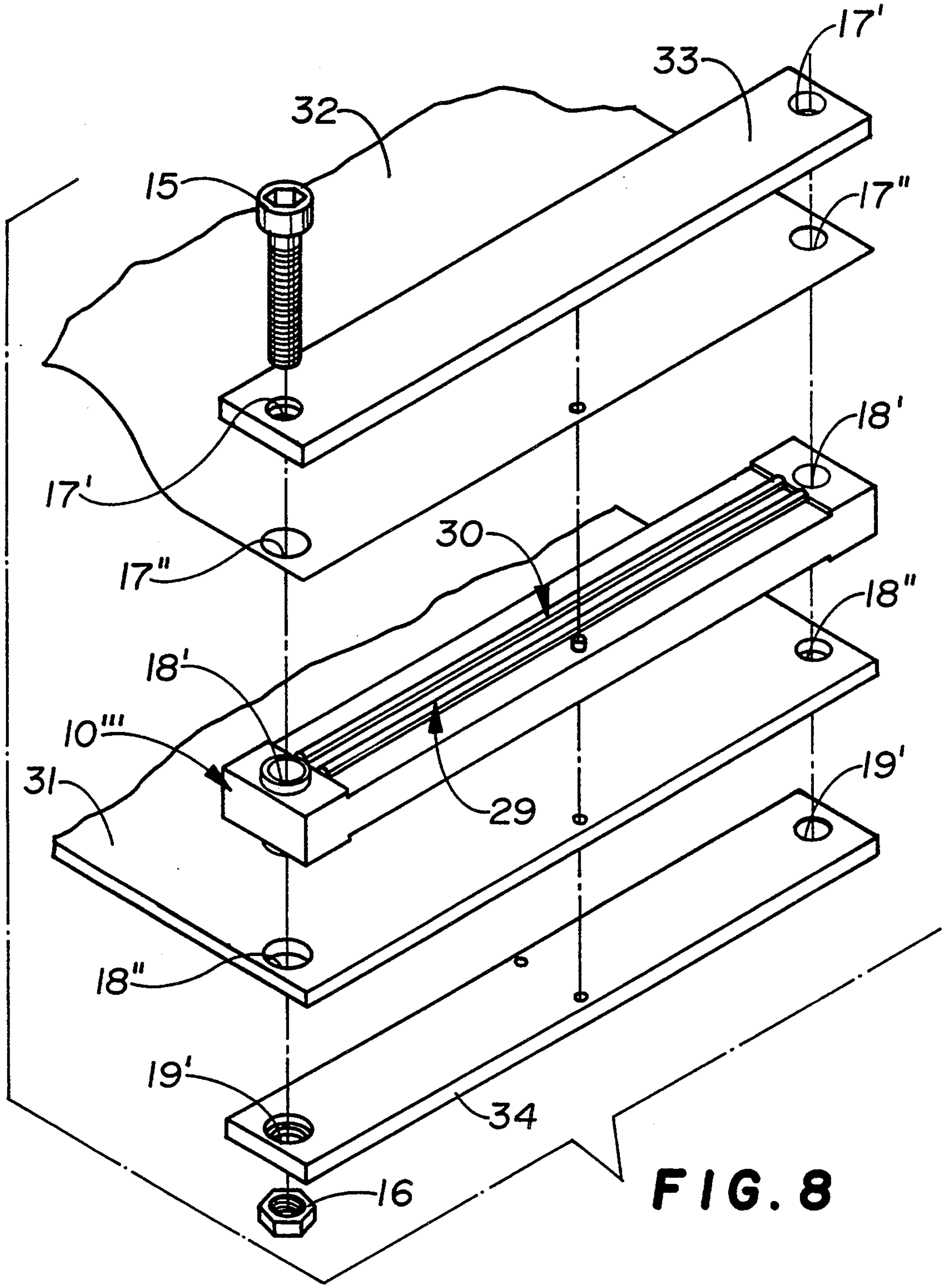
FIG. 8 is an exploded perspective of a fourth embodiment, showing the circuit interface between a flexible etched circuit and a printed circuit board, and further showing a pair of stiffeners for the overall assembly (and, again, the heat-radiating fins being omitted for ease of illustration).
Figure 9:
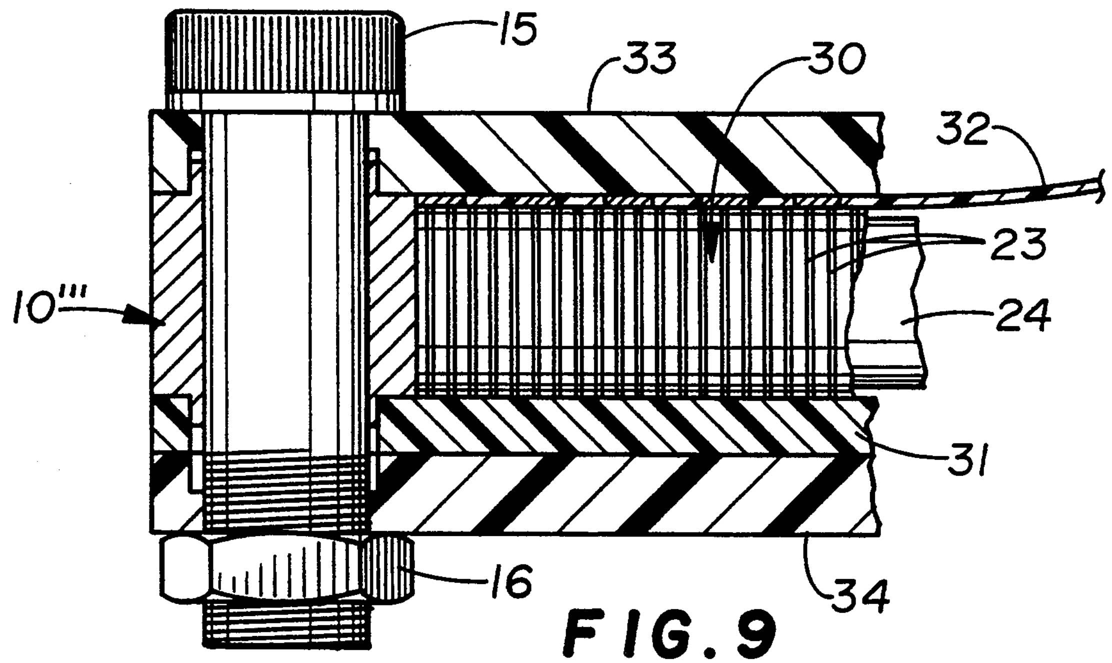
FIG. 9 is a partial longitudinal sectional view of the components of FIG. 9 in their assembled relationship, and drawn to an enlarged scale.

With reference to FIGS. 8 and 9, a pair of flexible electrical connectors 29 and 30, respectively, are mounted within a unitary heat sink and connector housing 10''' which, in turn, is disposed between a printed circuit board 31 and a flexible etched circuit 32. A pair of respective stiffeners 33 and 34 are provided outwardly of the flexible etched circuit 32 and printed circuit board 31, respectively, thereby assuring the structural integrity of the overall assembly.

Figure 10:
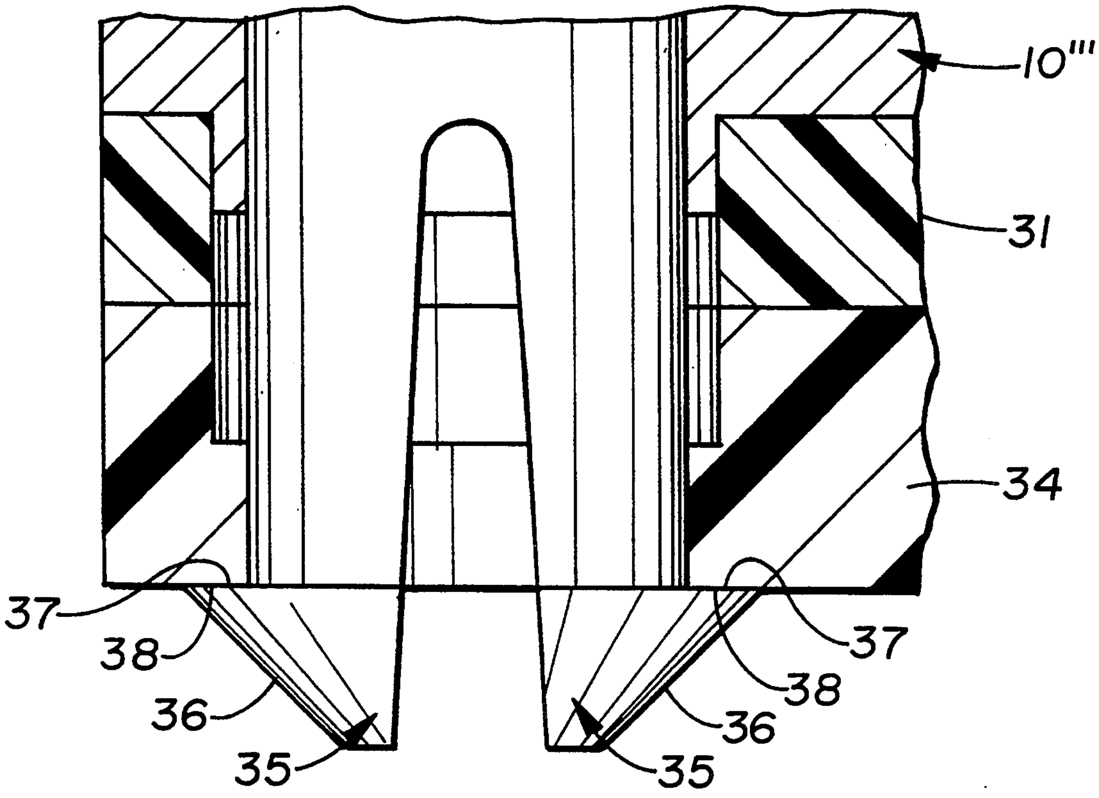
FIG. 10 corresponds substantially to FIG. 9, but shows an alternate means for securing the overall assembly.

With reference to FIG. 10, an alternate fastening means is provided for the overall assembly, comprising a pair of bifurcated spring-loaded latching fingers 35. Each of the latching fingers 35 has an inclined or tapered surface 36 terminating in an undercut 37 substantially at right angles thereto; and the lower stiffener 34 has a bottom surface 38 cooperating with the undercuts 37, such that the latching fingers 35 may be "snapped" into the respective aligned mounting holes 17, 18 and 19, respectively. For removal, the latching fingers 35 are simply squeezed together and lifted out of the mounting holes.

Thus it will be appreciated by those skilled in the art that the respective unitary heat sink and connector housings (10, 10', 10", 10''') of the present invention provide an elegant solution to a problem of longstanding in the design of miniaturized high-performance assemblies widely used in a variety of electronic products. By providing for good heat dissipation, product reliability is enhanced without sacrificing miniaturization; and the respective flexible electrical connector or connectors (21, 25, 26, 29 and 30) adapt to particular product and housing configurations and facilitate the desired circuit interface while providing a resilient "cushion" between the printed circuit boards and/or flexible etched circuits, thereby compensating for tolerance accumulations in the manufacture and assembly of the overall product.

Obviously, many modifications may be made without departing from the basic spirit of the present invention. For example, any of the combination heat sinks and connector housings 10', 10"and 10''' could be provided with heat-radiating fins 20 or other heat-dissipating means, if desired. Accordingly, it will be appreciated by those skilled in the art that within the scope of the appended claims, the invention may be practiced other than has been specifically described herein.

What is claimed is:

1. In an electrical assembly, the combination of a first electrical member having at least one first circuit element thereon, a second electrical member having at least one second circuit element thereon, a unitary heat sink and connector housing, made from a material which is thermally conductive but electrically insulative, and disposed between the first and second electrical members, means for securing the first and second electrical members to the unitary heat sink and connector housing, a unitary heat sink and connector housing having a through slot therein, and a flexible electrical connector mounted within said slot for electrical engagement with said first and second electrical members, whereby said flexible electrical connector includes at least one circuit trace thereon providing a circuit interface between the first and second circuit elements on the first and second electrical members, respectively.

2. The combination of claim 1, wherein the material of the unitary heat sink and connector housing comprises a ceramic.

3. The combination of claim 1, wherein the material is selected from the group consisting of anodized aluminum, silicon dioxide and beryllium oxide.

4. The combination of claim 1, wherein the unitary heat sink and connector housing has a plurality of heat-radiating fins.

5. The combination of claim 1, wherein the flexible electrical connector further has an elastomeric core compressed between the first and second electrical members.

6. The combination of claim 1, wherein each of the first and second electrical members comprises a printed circuit board.

7. The combination of claim 1, wherein said first and second electrical members each have a plurality of circuit elements thereon, and said unitary heat sink and connector housing includes a second through slot disposed substantially parallel to said first named through slot, where said second through slot includes a flexible electrical connector mounted within for electrical engagement with certain of said circuit elements.

8. The combination of claim 7, wherein each of the flexible electrical connectors has a tail, and the unitary heat sink and connector housing includes an undercut portion for supporting the respective tails.

9. An electrical assembly, comprising a first electrical member having a plurality of first circuit elements thereon, a second electrical member having a plurality of second circuit elements thereon, a unitary heat sink and connector housing disposed between the first and second electrical members and made from a material which is thermally conductive but electrically insulative, heat-radiating means on the unitary heat sink and connector housing, means for securing the unitary heat sink and connector housing to the first and second electrical members, the unitary heat sink and connector housing having an opening formed therein, and at least one flexible electrical connector within the opening in the unitary heat sink and connector housing, the flexible electrical connector having an elastomeric core compressed between the first and second electrical members, and the flexible electrical connector further having a plurality of circuit traces carried by the elastomeric core and providing a circuit interface between the first and second plurality of circuit elements on the first and second electrical members, respectively.

10. A combination heat sink and connector housing, comprising a unitary member having a plurality of heat-radiating fins formed thereon and made from a material selected from the group consisting of anodized aluminum, silicon dioxide and beryllium oxide, such that the unitary member is thermally conductive but electrically insulative, the unitary member having an opening formed therein, and a flexible electrical connector in the opening in the unitary member, the flexible electrical connector having an elastomeric core and further having a plurality of closely-spaced circuit traces carried by the elastomeric core.

11. A combination heat sink and connector housing, comprising a unitary member having a plurality of heat-radiating fins formed thereon and made from a ceramic material, such that the unitary member is thermally conductive but electrically insulative, the unitary member having an opening formed therein, and a flexible electrical connector in the opening in the unitary member, the flexible electrical connector having an elastomeric core and further having a plurality of closely-spaced circuit traces carried by the elastomeric core.

* * * * *